(12) United States Patent
Sreenivasan

(10) Patent No.: US 7,927,541 B2
(45) Date of Patent: Apr. 19, 2011

(54) FULL-WAFER OR LARGE AREA IMPRINTING WITH MULTIPLE SEPARATED SUB-FIELDS FOR HIGH THROUGHPUT LITHOGRAPHY

(75) Inventor: Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 170 days.

(21) Appl. No.: 12/430,428

(22) Filed: Apr. 27, 2009

(65) Prior Publication Data

US 2009/0200709 A1 Aug. 13, 2009

Related U.S. Application Data

(63) Continuation of application No. 10/788,700, filed on Feb. 27, 2004, now abandoned, and a continuation-in-part of application No. 11/669,569, filed on Jan. 31, 2007, now Pat. No. 7,699,598.

(51) Int. Cl.
*B29C 59/00* (2006.01)
(52) U.S. Cl. ............... 264/509; 264/297.6; 264/319
(58) Field of Classification Search ............ 264/509, 264/297.6, 319
See application file for complete search history.

(56) References Cited

U.S. PATENT DOCUMENTS

| 5,669,303 | A | * | 9/1997 | Maracas et al. | 101/327 |
| 5,804,017 | A | * | 9/1998 | Hector | 156/242 |
| 6,305,925 | B1 | * | 10/2001 | Cassani | 425/405.1 |

* cited by examiner

*Primary Examiner* — Joseph S Del Sole
*Assistant Examiner* — James Sanders
(74) *Attorney, Agent, or Firm* — Laura C. Robinson

(57) ABSTRACT

A layer on a substrate is formed using an imprint lithography system. The layer is formed by providing a plurality of flowable regions on the substrate, spreading material in the flowable regions, and contacting the regions with a plurality of imprint lithography molds that are disposed on a template.

17 Claims, 6 Drawing Sheets

FULL-WAFER OR LARGE AREA IMPRINTING WITH MULTIPLE SEPARATED SUB-FIELDS FOR HIGH THROUGHPUT LITHOGRAPHY

CROSS REFERENCE TO RELATED APPLICATION

This application is a Continuation of U.S. patent application Ser. No. 10/788,700 filed on Feb. 27, 2004, which is hereby incorporated by reference. This application is also a Continuation-in-Part of U.S. patent application Ser. No. 11/669,569 filed on Jan. 31, 2007, which is a Continuation of U.S. patent application Ser. No. 10/614,716 filed on Jul. 7, 2003 and claims priority to U.S. Provisional 60/394,458 filed on Jul. 8, 2002; all of which are hereby incorporated by reference.

BACKGROUND INFORMATION

The field of invention relates generally to imprint lithography. More particularly, the present invention is directed to a method of depositing and patterning materials on a substrate during imprint lithography processes.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication includes forming a relief image in a structure by depositing a polymerizable fluid composition onto a transfer layer. The transfer layer may be a sacrificial layer providing a mask for patterning the substrate or the substrate itself. A mold makes mechanical contact with the polymerizable fluid. The mold includes a relief structure, and the polymerizable fluid composition fills the relief structure. The polymerizable fluid composition is then subjected to conditions to solidify and to polymerize the same, forming a solidified polymeric material on a transfer layer that contains a relief structure complimentary to that of the mold. The mold is then separated from the solid polymeric material such that a replica of the relief structure in the mold is formed in the solidified polymeric material. The solidified polymeric material is subjected to an environment to selectively etch the transfer layer relative to the solidified polymeric material such that a relief image is formed in the transfer layer. With this process, patterns with features on the scale of a few nanometers may be formed. As a result, substrates may demonstrate extreme topologies when compared to the dimensions of features formed thereon, wherein such extreme topologies may potentially prevent accurate reproduction of the pattern in the solidified polymeric layer.

In order to maximize the throughput and to minimize the cost of micro-fabrication, the size of the wafer being patterned is increased. However, increasing the wafer size may exacerbate the non-planarity of the substrate being patterned, and may also increase the filling time needed to dispense the polymerizable fluid composition upon the substrate.

DETAILED DESCRIPTION OF THE INVENTION

Figure 1:
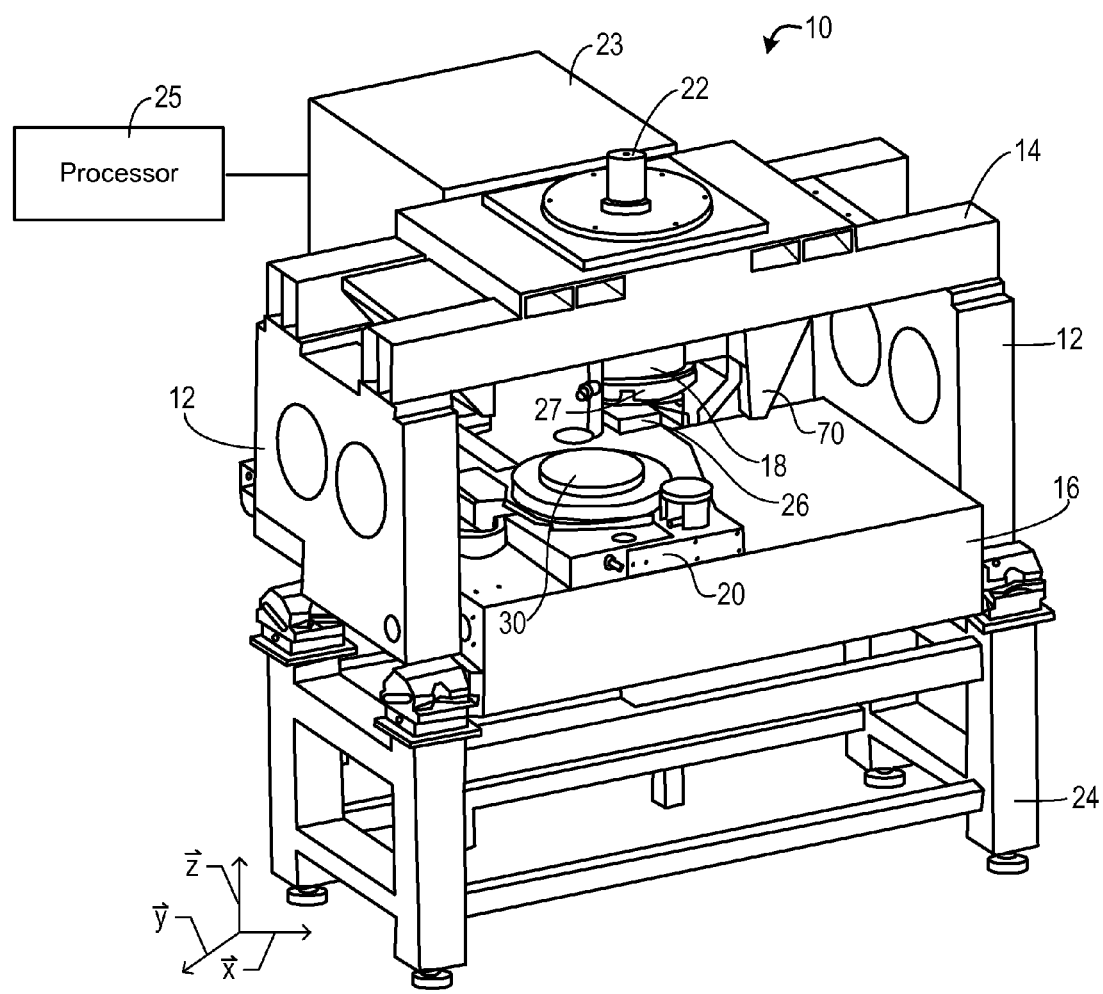
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16 and provides movement along the Z-axis. Disposed upon stage support 16 to face imprint head 18 is a motion stage 20. Motion stage 20 is configured to move with respect to stage support 16 along X- and Y-axes. It should be understood that imprint head 18 may provide movement along the X- and Y-axes, as well as the Z-axis, and motion stage 20 may provide movement in the Z-axis, as well as the X- and Y-axes. An exemplary motion stage device is disclosed in U.S. Pat. No. 6,900,881 entitled "Step and Repeat Imprint Lithography Systems," which is assigned to the assignee of the present invention, and which is incorporated by reference herein in its entirety. A radiation source 22 is coupled to lithographic system 10 to impinge actinic radiation upon motion stage 20. As shown, radiation source 22 is coupled to bridge 14 and includes a power generator 23 connected to radiation source 22. Operation of lithographic system 10 is typically controlled by a processor 25 that is in data communication therewith. An exemplary system 10 is available under the trade name IMPRIO® 100 from Molecular Imprints, Inc. having a place of business at 1807-C Braker Lane, Suite 100, Austin, Tex. 78758.

Figure 2:
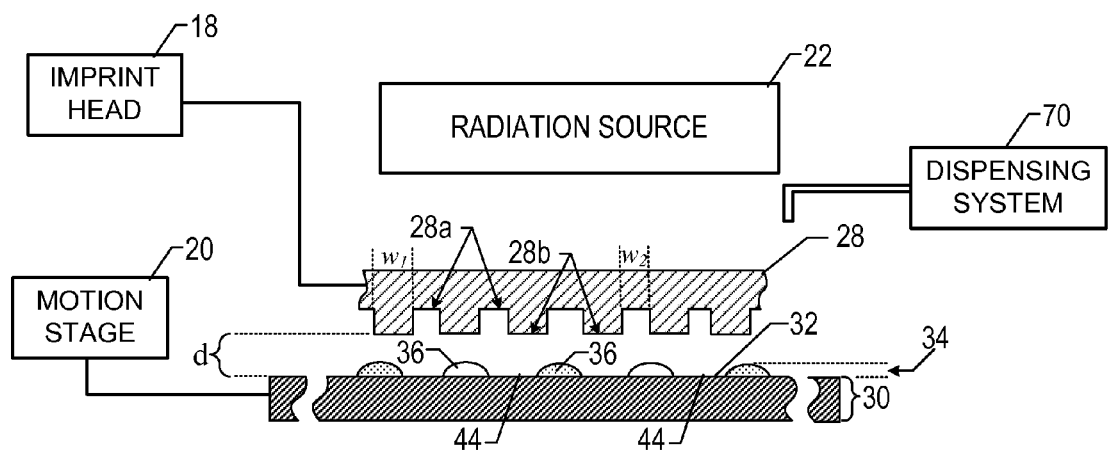
FIG. 2 is a simplified elevation view of a lithographic system shown in FIG. 1.

Referring to both FIGS. 1 and 2, connected to imprint head 18, via a chuck 27, is a template 26 having a mold 28 thereon. An exemplary chuck is disclosed in U.S. Pat. No. 7,019,816 entitled "A Chucking System for Modulating Shapes of Substrates," which is assigned to the assignee of the present invention and is incorporated by reference in its entirety herein. Mold 28 includes a plurality of features defined by a plurality of spaced-apart recessions 28a and protrusions 28b. The plurality of features defines an original pattern that forms the basis of a pattern to be transferred into a substrate 30 positioned on motion stage 20. To that end, imprint head 18 and/or motion stage 20 may vary a distance "d" between mold 28 and substrate 30. In this manner, the features on mold 28 may be imprinted into a flowable region of substrate 30, discussed more fully below. Radiation source 22 is located so that mold 28 is positioned between radiation source 22 and substrate 30. As a result, mold 28 is fabricated from a material that allows it to be substantially transparent to the radiation produced by radiation source 22.

Figure 3:
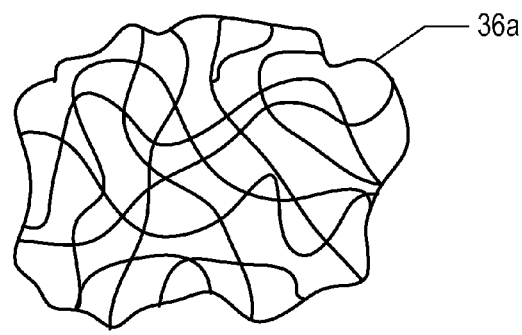
FIG. 3 is a simplified representation of material from which an imprinting layer shown in FIG. 2 is comprised before being polymerized and cross-linked.

Referring to both FIGS. 2 and 3, a flowable region, such as an imprinting layer 34, is disposed on a portion of a surface 32 that presents a substantially planar profile. In the present embodiment, a flowable region consists of imprinting layer 34 being deposited as a plurality of spaced-apart discrete droplets 36 of a material 36a on substrate 30, discussed more fully below. An exemplary system for depositing droplets 36 is shown as a dispensing system 70, in FIG. 1, and is discussed more fully below with reference to FIG. 7.

Referring again to FIGS. 2 and 3, imprinting layer 34 is formed from material 36a that may be selectively polymerized and cross-linked to record the original pattern therein, defining a recorded pattern. An exemplary composition for material 36a is disclosed in U.S. Pat. No. 7,157,036 entitled "Method to Reduce Adhesion Between a Conformable Region and a Pattern of a Mold," which is incorporated by reference in its entirety herein. Material 36a is shown in FIG. 4 as being cross-linked at points 36b, forming a cross-linked polymer material 36c.

Figure 5:
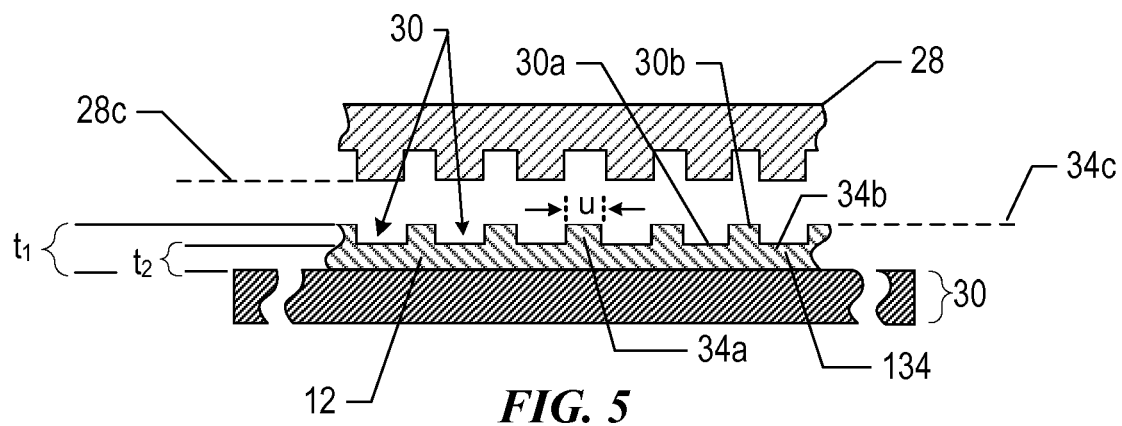
FIG. 5 is a simplified elevation cross-sectional view of a mold spaced-apart from the imprinting layer, shown in FIG. 1, after patterning of the imprinting layer.

Referring to FIGS. 2, 3 and 5, the pattern recorded in imprinting layer 34 is produced, in part, by mechanical contact with mold 28. To that end, distance "d" is reduced to allow imprinting droplets 36 to come into mechanical contact with mold 28, spreading droplets 36 so as to form imprinting layer 34 with a contiguous formation of material 36a over surface 32. In one embodiment, distance "d" is reduced to allow sub-portions 34a of imprinting layer 34 to ingress into and to fill recessions 28a.

To facilitate filling of recessions 28a, material 36a is provided with the requisite properties to completely fill recessions 28a, while covering surface 32 with a contiguous formation of material 36a. In the present embodiment, sub-portions 34b of imprinting layer 34 in superimposition with protrusions 28b remain after the desired, usually minimum, distance "d", has been reached, leaving sub-portions 34a with a thickness $t_1$, and sub-portions 34b with a thickness $t_2$. Thicknesses "$t_1$" and "$t_2$" may be any thickness desired, dependent upon the application. Typically, $t_1$ is selected so as to be no greater than twice the width u of sub-portions 34a, i.e., $t_1 \leqq 2u$, shown more clearly in FIG. 5.

Figure 4:
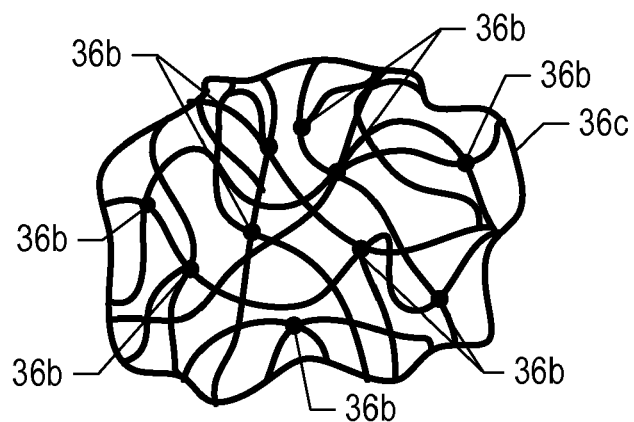
FIG. 4 is a simplified representation of cross-linked polymer material into which the material shown in FIG. 3 is transformed after being subjected to radiation.

Referring to FIGS. 2, 3 and 4, after a desired distance "d" has been reached, radiation source 22 produces actinic radiation that polymerizes and cross-links material 36a, forming cross-linked polymer material 36c. As a result, the composition of imprinting layer 34 transforms from material 36a to cross-linked polymer material 36c, which is a solid. Specifically, cross-linked polymer material 36c is solidified to form solidified imprinting layer 134 with a side having a shape that conforms to a shape of a surface 28c of mold 28, shown more clearly in FIG. 5. After formation of solidified imprinting layer 134, distance "d" is increased so that mold 28 and solidified imprinting layer 134 are spaced-apart.

Referring to FIG. 5, additional processing may be employed to complete the patterning of substrate 30. For example, substrate 30 and imprinting layer 34 may be etched to transfer the pattern of imprinting layer 34 into substrate 30. To facilitate etching, the material from which imprinting layer 34 is formed may be varied to define a relative etch rate with respect to substrate 30, as desired. The relative etch rate of imprinting layer 34 to substrate 30 may be in a range of about 1.5:1 to about 100:1.

Figure 6:
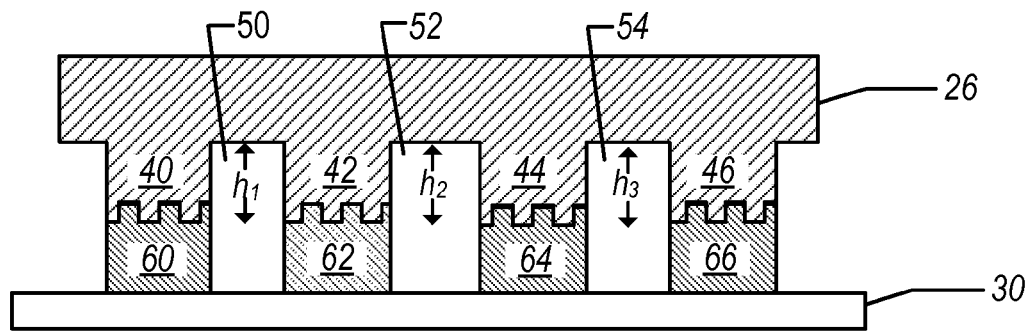
FIG. 6 is a simplified elevational view of the template, shown in FIGS. 1 and 2, in accordance with the present invention.

Referring to FIGS. 3 and 6, typically template 26 includes a plurality of molds, shown as 40, 42, 44, and 46, each of which may include a common pattern or differing patterns. Further, molds 40, 42, 46, and 48 may be arranged on template 26 as a matrix. Although four molds are shown, any number may be present. Each of molds 40, 42, 44, and 46 may be described as mold 28 with respective lithographic processes that apply to mold 28 apply with equal measure to each of molds 40, 42, 44, and 46. Each of molds 40, 42, 44, and 46 are separated from an adjacent mold 40, 42, 44, and 46 by a recess. As shown, a recess 50 is defined between molds 40 and 42, a recess 52 is defined between molds 42 and 46, and a recess 54 is defined between molds 46 and 48. The height, $h_1$, $h_2$, and $h_3$, of each recess 50, 52, and 54, respectively, are substantially greater than the depth of recession 28a, shown in FIG. 2. As a result, upon application of the appropriate forces between template 26 and material 36a, material 36a in superimposition with each of molds 40, 42, 44, and 46 will not extrude from a region of substrate 30 coextensive with molds 40, 42, 44, and 46. It is believed that this is due in part to capillary attraction between molds 40, 42, 44, and 46 and material 36a in superimposition therewith. This allows spreading of material 36a to cover an area of substrate 30 that has a desired shape as defined by the shape of molds 40, 42, 44, and 46. For example, the area of substrate 30 over which material 36a may be spread may have any geometric shape known, e.g., circular, polygonal, and the like.

Figure 7:
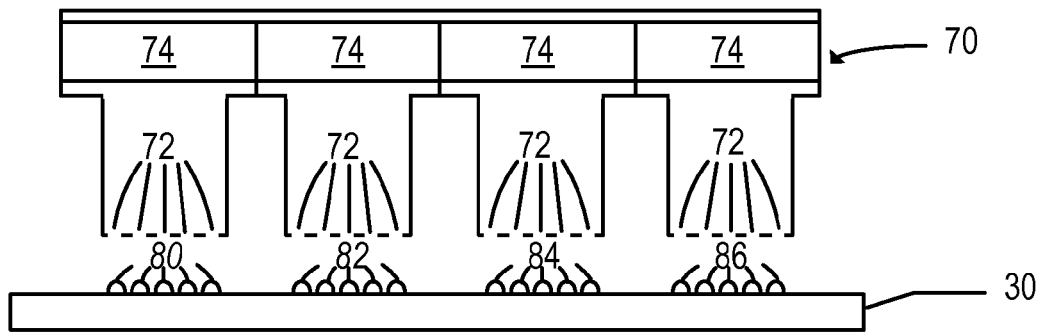
FIG. 7 is a simplified elevational view of a dispensing system, shown in FIG. 1, in accordance with the present invention.

Referring to FIGS. 6 and 7, taking advantage of these properties, imprinting layer 34 may be formed on substrate 30 as a plurality of spaced-apart layer segments, shown as 60, 62, 64, and 66. To that end, dispensing system 70 may include a plurality of jet nozzles 72, each of which is in fluid communication with one or more of a plurality of material reservoirs 74. The number of jet nozzles 72 may be equal to an integer multiple of the number of molds present on template 26. Material reservoirs 74 contain material to be deposited on substrate 30, such as material 36a, shown in FIG. 3, or some other material.

Referring to FIGS. 1 and 7, an exemplary system implemented as fluid dispensing system 70 is described by Steinerta et al. in "An Improved 24 Channel Picoliter Dispenser Based on Direct Liquid Displacement," published at The 12th International Conference on Solid State Sensors, Actuators and Microsystems, Boston, Jun. 8-12, 2003. Specifically, by providing material reservoirs 74 with material 36a, shown in FIG. 3, a plurality of flowable regions may be formed on substrate 30 concurrently. As shown, the first flowable region includes droplets 80; a second flowable region includes droplets 82; a third flowable region includes droplets 84; and a fourth flowable region includes droplets 86. Droplets 80, 82, 84, and 86 may be dispensed upon substrate 30 in identical patterns.

Upon dispensing droplets 80, 82, 84, and 86 upon substrate 30, droplets 80, 82, 84, and 86 may be patterned according to molds 40, 42, 44, and 46. Specifically droplets 80 may be patterned by mold 40 forming layer segment 60; droplets 82 may be patterned by mold 42 forming layer segment 62; droplets 84 may be patterned by mold 44 forming layer segment 64; and droplets 86 may be patterned by mold 46 forming layer segment 66.

As a result of forming the plurality of flowable regions on substrate 30 concurrently, any evaporative effects of material 36a, shown in FIG. 3, will be substantially identical within droplets 80, 82, 84 and 86. This facilitates control of the thickness of solidified imprinting layer so that all thicknesses $t_1$ are substantially uniform and all thicknesses $t_2$ are substantially uniform. As a result, the dimensions of the features transferred into substrate 30 may be precisely controlled. This minimizes undesirable etch rate differentials over the area of solidified imprinting layer. Additionally the time required to form a patterned layer is reduced, because the time in which multiple droplets 80, 82, 84, and 86 are dispensed and fill the features of mold 28, e.g., the fill time, is equivalent to the time required to dispense a single droplet. The fill time is on the order of seconds.

Figure 8:
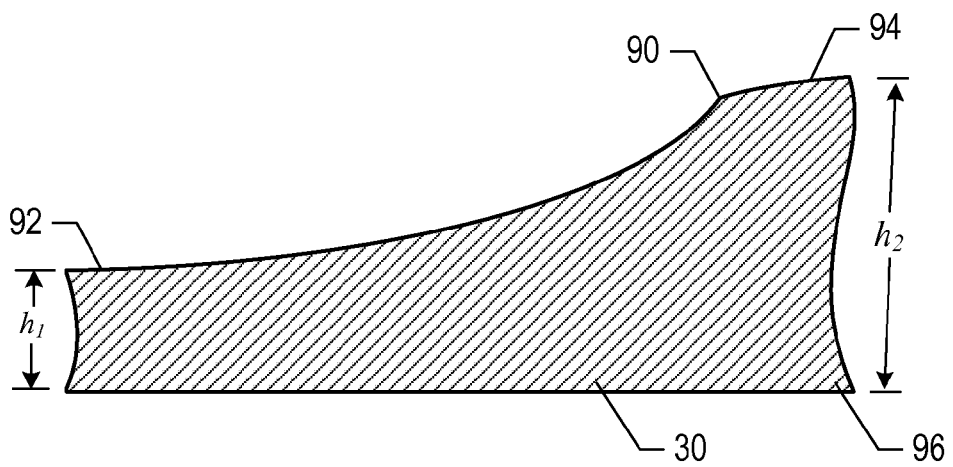
FIG. 8 is a detailed view demonstrating the non-planarity of the substrate in accordance with the prior art.

As mentioned above, each of molds 40, 42, 44, and 46 makes mechanical contact with droplets 80, 82, 84, and 86, respectively. However, the area of substrate 30 that is covered with droplets 80, 82, 84, and 86 may comprise an extreme topology when compared to the dimensions of features formed thereon. An example of such an extreme topology is depicted in FIG. 8, wherein substrate 30 appears to present a non-planar surface 90. This has been traditionally found in substrates formed from gallium arsenide (GAs) or indium phosphide (InP). However, as the feature dimensions decrease, substrates that have historically been considered planar may present a non-planar surface to features formed thereon. For example, substrate 30 is shown with variations in surface height.

The variations in surface height of substrate 30 frustrates the patterning of droplets 80, 82, 84, and 86 because of the resulting differences in distances between surface regions 92 and 94 as measured from a backside 96 of substrate 30, as $h_1$ and $h_2$, respectively. The height differential, $\Delta h$, between regions 92 and 94 is defined as follows:

$$\Delta h = |h_1 - h_2| \qquad (EQ. 1)$$

Height differential, $\Delta h$, may be problematic during the imprinting process and/or one or more post imprinting process, e.g., etching.

Figure 9A:
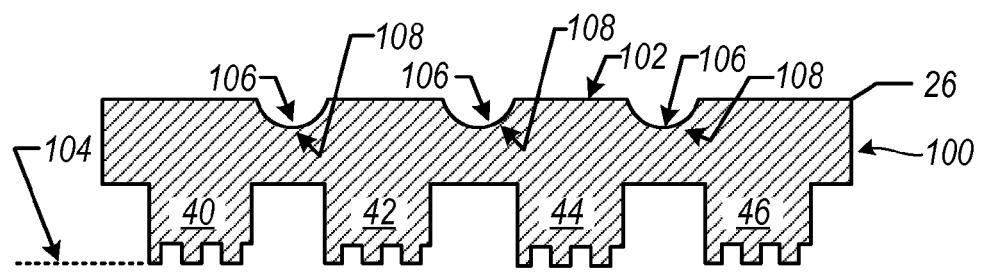
FIGS. 9A-9B are simplified plan views of a template employed to pattern the substrate, shown in FIG. 5, in accordance with the present invention.

Referring to FIGS. 8 and 9A, to overcome the problems resulting from height differential, $\Delta h$, template 26 may be made to conform to non-planar surface 90 for patterning liquids, such as material 36a, shown in FIG. 3, disposed on substrate 30. Specifically, template 26 includes a body 100 having opposed first surface 102 and second surface 104. First surface 102 includes a plurality of recessed regions 106 with molds 40, 42, 44, and 46 being disposed between adjacent recessed regions 106. Specifically, recessed regions 106 define flexure regions 108 about which each of molds 40, 42, 44, and 46 may move independent of one another. As shown, molds 40, 42, 44, and 46 are areas of second surface 104 positioned between adjacent flexure regions 108.

Figure 9B:
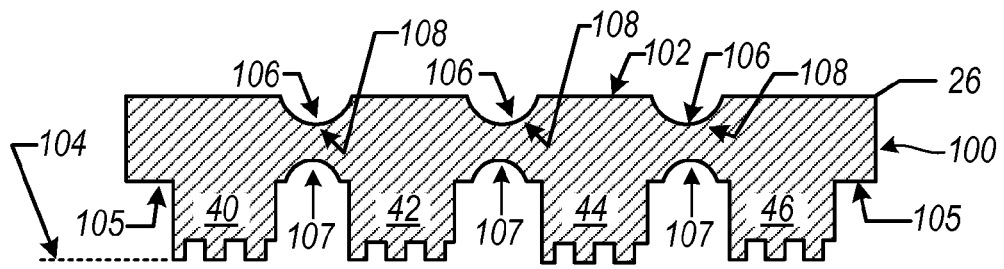

Referring to FIG. 9B, in a further embodiment, body 100 comprises a third surface 105. Third surface 105 includes a plurality of recessed regions 107, wherein recessed regions 107 define flexure regions 109 and may be described analogously to recessed regions 106, shown in FIG. 9A.

Figure 10:
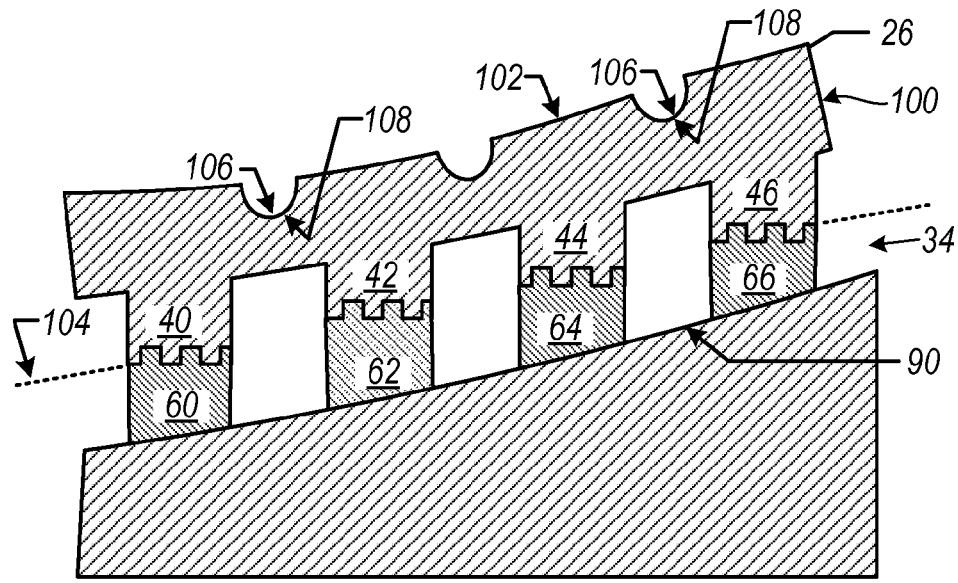
FIG. 10 is a simplified plan view showing the template, shown in FIG. 9A, in contact with the imprinting material disposed on the substrate, shown in FIG. 8.
Figure 11:
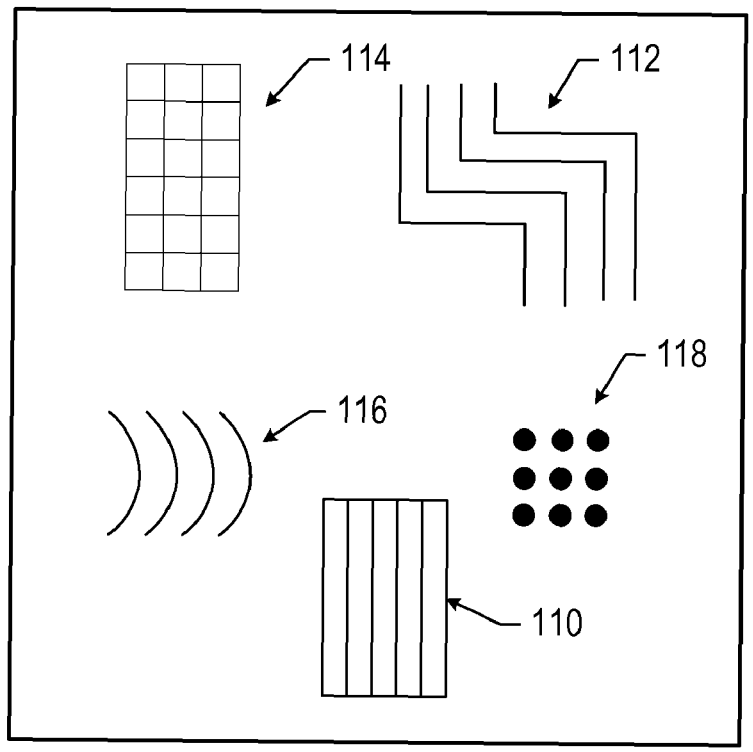
FIG. 11 is simplified plan view showing the various patterns that may be included with the template, shown in FIGS. 2 and 9A, in accordance with the present invention.

Referring to both FIGS. 3 and 10, during imprinting of material 36a, template 26 compresses material 36a between second surface 104 and non-planar surface 90 forming imprinting layer 34, and more specifically mold 40 compresses material 36a forming layer segment 60 of imprinting layer 34; mold 42 compresses material 36a forming layer segment 62 of imprinting layer 34; mold 44 compresses material 36a forming layer segment 64 of imprinting layer 34; and mold 46 compresses material 36a forming layer segment 66 of imprinting layer 34. Recessed regions 106 allow flexing of body 100 about the plurality of flexure regions 108. In this manner, template 26 conforms to the profile of non-planar surface 90 defined, in part, by the height differential $\Delta h$. Material 36a may be disposed on non-planar surface 90 and solidified, as described above with respect to FIGS. 1-5. As mentioned above, molds 40, 42, 44, and 46 may comprise any type of pattern, such as uniform periodic features having common shapes, as well as features having differing shapes. Exemplary patterns include a series of linear grooves/projections 110, a series of L-Shaped grooves/projections 112, a series of intersecting grooves/projections defining a matrix 114, a series of arcuate grooves/projections 116, and pillars 118 that have any cross-sectional shape desired, e.g., circular, polygonal, etc., shown in FIG. 11.

Figure 12:
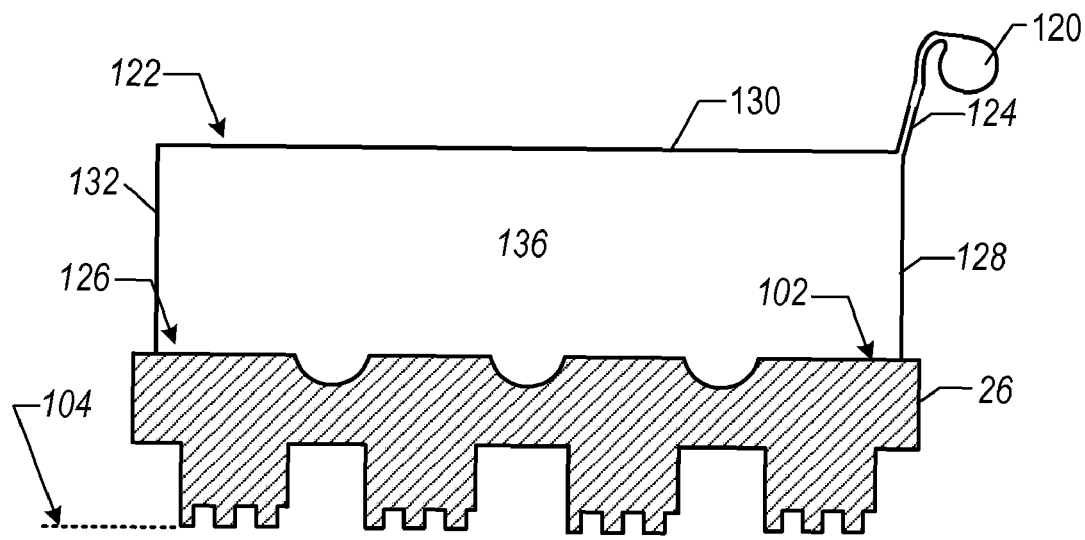
FIG. 12 is a simplified plan view showing the template coupled to a device to apply pressure to one side of the template in accordance with an alternate embodiment of the present invention.

Referring to FIG. 12, to facilitate conforming template 26 to a surface, a fluid source, such as a pump 120, may be placed in fluid communication with first surface 102 to vary a pressure present. To that end, a fluid chamber 122 includes an inlet 124 and a throughway 126. Template 26 is mounted in throughway 126 to substantially restrict fluid flow there through. As a result template 26 and sides 128, 130, and 132 define a volume 136. Sides 128, 130, and 132 may be more rigid than template 26. In this fashion, template 26 may be more sensitive to variations in pressure changes occurring in volume 136 than sides 128, 130, and 132. As a result, pump 120 may pressurize or evacuate volume 136 as desired to vary a shape of template 26 to facilitate conformation of template 26 with a surface adjacent to second side 104.

Referring to FIGS. 1, 3 and 6, the characteristics of material 36a are important to efficiently pattern substrate 30 in light of the unique deposition process employed. As mentioned above, material 36a is deposited on substrate 30 as a plurality of discrete and spaced-apart droplets 36. The combined volume of droplets 36 is such that the material 36a is distributed appropriately over an area of surface 32 where imprinting layer 34 is to be formed. As a result, imprinting layer 34 is spread and patterned concurrently with the pattern being subsequently set by exposure to radiation, such as electromagnetic activation radiation. As a result of the deposition process, it is desired that material 36a have certain characteristics to facilitate rapid and even spreading of material 36a in droplets 36 over surface 32 so that the all thicknesses $t_1$ are substantially uniform and all thickness $t_2$ are substantially uniform. Exemplary materials are disclosed in U.S. Pat. No. 7,157,036 which is incorporated by reference herein in its entirety.

The embodiments of the present invention described above are exemplary. For example, anomalies in processing regions other than film thickness may be determined. For example, distortions in the pattern may formed in imprinting layer may be sensed and the cause of the same determined employing the present invention. As a result, many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. In an imprint lithography system, a method of forming a material layer on a substrate, the method comprising:
   forming a plurality of flowable regions of the material on the substrate;
   contacting the material in the flowable regions with a plurality of physically separate imprint lithography molds disposed on a template, each imprint lithography mold having three dimensional relief patterns thereby causing the material in each of the flowable regions to conform to a corresponding one of the three dimensional relief patterns;
   inducing localized sections of the template to flex by urging the localized sections of the template to further engage each of the imprint lithography molds with the material in the flowable regions so the imprint lithography molds conform to a topography of the substrate, wherein flexing of the template at a first localized section is different from flexing of the template at a second localized section; and
   solidifying the material in the flowable regions so each of the flowable regions maintains three dimensional patterns conforming to a corresponding one of the three dimensional relief patterns of the imprint lithography molds, wherein an area surrounding each imprint lithography mold has features that facilitate the flexing of the localized sections of the template.

2. The method as recited in claim 1, wherein forming further includes forming the flowable regions to have a one to one correspondence to the imprint lithography molds.

3. The method as recited in claim 1, wherein the material is confined within a defined area of the flowable region when imprinted with one of the three dimensional patterns.

4. The method as recited in claim 1, wherein solidifying further includes applying electromagnetic activation energy to the flowable regions.

5. The method as recited in claim 1, wherein contacting further includes flexing the template at a region between adjacent molds of the imprint lithography molds.

6. The method of claim 1, wherein forming further includes forming the plurality of flowable regions concurrently.

7. The method as recited in claim 1, wherein forming further includes forming each of the plurality of flowable regions to be spaced apart from adjacent flowable regions of the plurality of flowable regions.

8. The method as recited in claim 1, wherein subsequent to the solidifying step, the substrate is populated by a plurality of physically separated imprinted layers corresponding to the plurality of flowable regions.

9. In an imprint lithography system, a method of forming a material layer on an imprint lithography substrate, the method comprising:
   forming a plurality of flowable regions of a material on the imprint lithography substrate;
   providing each of the plurality of flowable regions with a surface having a desired three dimensional shape;
   contacting the plurality of flowable regions with a plurality of imprint lithography molds disposed on a template, each imprint lithography mold having three dimensional relief patterns causing the material in each of the flowable regions to conform to a corresponding one of the three dimensional relief patterns, wherein an area surrounding each imprint lithography mold has features that facilitate the flexing of the localized sections of the template; and,
   solidifying the plurality of flowable regions so that the plurality of flowable regions maintain three dimensional patterns conforming to the three dimensional relief patterns of the plurality of imprint lithography molds.

10. The method as recited in claim 9, wherein forming further includes forming the plurality of flowable regions to have a one to one correspondence to the plurality of imprint lithography molds.

11. The method as recited in claim 9, wherein solidifying further includes applying electromagnetic activation energy to the plurality of flowable regions.

12. The method as recited in claim 9, wherein the material is confined within a defined area of the flowable region when imprinted with one of the three dimensional patterns.

13. The method as recited in claim 9, wherein subsequent to the solidifying step, the substrate is populated by a plurality of physically separated imprinted layers corresponding to the plurality of flowable regions.

14. A method of forming a layer on a substrate, the method comprising:
   forming a plurality of flowable regions on the substrate;
   spreading a material in the plurality of flowable regions over the substrate while confining the material associated with each of the plurality of flowable regions to an area;
   contacting the flowable regions with a plurality of imprint lithography molds disposed on a template, wherein an area surrounding each imprint lithography mold has features that facilitate the flexing of the localized sections of the template and flexing the template to conform to a topography of the substrate; and
   solidifying the plurality of flowable regions.

15. The method as recited in claim 14, wherein forming further includes forming the plurality of flowable regions to have a one to one correspondence to the plurality of imprint lithography molds.

16. The method as recited in claim 14, wherein solidifying further includes applying electromagnetic activation energy to the plurality of flowable regions.

17. The method as recited in claim 14 wherein subsequent to the solidifying step, the substrate is populated by a plurality of physically separated imprinted layers corresponding to the plurality of flowable regions.

* * * * *